(12) United States Patent
Park et al.

(10) Patent No.: US 9,480,165 B2
(45) Date of Patent: Oct. 25, 2016

(54) FLEXIBLE SUBSTRATES AND METHOD OF MANUFACTURING THE SAME

(71) Applicant: SAMSUNG DISPLAY CO., LTD., Yongin, Gyeonggi-Do (KR)

(72) Inventors: Daejin Park, Incheon (KR); Myeonghee Kim, Yongin-si (KR); Min Ho Yoon, Namyangju-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 319 days.

(21) Appl. No.: 14/270,745

(22) Filed: May 6, 2014

(65) Prior Publication Data

US 2014/0238582 A1 Aug. 28, 2014

Related U.S. Application Data

(62) Division of application No. 13/371,732, filed on Feb. 13, 2012, now Pat. No. 8,941,011.

(30) Foreign Application Priority Data

Aug. 16, 2011 (KR) .................. 10-2011-0081359

(51) Int. Cl.
*H05K 3/00* (2006.01)
*H05K 3/46* (2006.01)
(Continued)

(52) U.S. Cl.
CPC ............. *H05K 3/007* (2013.01); *B32B 33/00* (2013.01); *B32B 37/0007* (2013.01); *H05K 1/0366* (2013.01); *H05K 1/0393* (2013.01); *H05K 3/4682* (2013.01); *B32B 37/003* (2013.01); *B32B 2038/0076* (2013.01); *B32B 2305/18* (2013.01); *B32B 2307/412* (2013.01); *B32B 2307/546* (2013.01); *B32B 2309/68* (2013.01); *B32B 2457/20* (2013.01); *G02F 1/133305* (2013.01); *H05K 1/0346* (2013.01); *H05K 2201/0108* (2013.01); *H05K 2201/029* (2013.01)

(58) Field of Classification Search
CPC ......................... H05K 3/007; H05K 3/4682
See application file for complete search history.

(56) References Cited

U.S. PATENT DOCUMENTS

| 7,663,708 B2 | 2/2010 | Wang et al. |
| 7,880,849 B2 | 2/2011 | Kim et al. |
| 2009/0256985 A1 | 10/2009 | Jung et al. |

FOREIGN PATENT DOCUMENTS

| JP | 07-199164 | 8/1995 |
| JP | 10-301140 | 11/1998 |

(Continued)

OTHER PUBLICATIONS

H. Iba., et al., "Optically Transparent Continous Glass Fibre-Reinforced Epdxy Matrix Composite: Fabrication, Optical and Mechanical Properties," Composites Science and Technology 62 (2002), pp. 2043-2052.

*Primary Examiner* — Jeremy C Norris
(74) *Attorney, Agent, or Firm* — F. Chau & Associates, LLC

(57) ABSTRACT

A flexible substrate includes a flexible mother substrate and a planarization layer on the flexible mother substrate. Here, the flexible mother substrate includes a transparent textile and a resin layer. The transparent textile includes a plurality of first transparent fibers and a plurality of second transparent fibers crossing the plurality of first transparent fibers, and the resin layer coats the transparent textile to fill a space between the first and second transparent fibers. The planarization layer includes an organic material having a curable contraction rate of no greater than about 20%.

19 Claims, 13 Drawing Sheets

(51) Int. Cl.
    *B32B 33/00*   (2006.01)
    *B32B 37/00*   (2006.01)
    *B32B 38/00*   (2006.01)
    *H05K 1/03*   (2006.01)
    *G02F 1/1333*   (2006.01)

(56) References Cited

FOREIGN PATENT DOCUMENTS

| | | |
|---|---|---|
| JP | 2001-191350 | 7/2001 |
| JP | 2004-053051 | 2/2004 |
| JP | 2005-014270 | 1/2005 |
| JP | 2005-140976 | 2/2005 |
| JP | 2007-003910 | 1/2007 |
| JP | 2008-180754 | 8/2008 |
| JP | 2009-241522 | 10/2009 |
| JP | 2009-244756 | 10/2009 |
| KR | 1020020088093 | 11/2002 |
| KR | 1020050094823 | 10/2005 |
| KR | 1020080004067 | 1/2008 |
| KR | 1020080068376 | 7/2008 |
| KR | 1020100006461 | 1/2010 |
| KR | 1020100016569 | 2/2010 |

FLEXIBLE SUBSTRATES AND METHOD OF MANUFACTURING THE SAME

CROSS-REFERENCE TO RELATED APPLICATIONS

This application is a divisional application of co-pending U.S. application Ser. No. 13/371,732, filed on Feb. 13, 2012, which claims priority to Korean Patent Application No. 10-2011-0081359 filed on Aug. 16, 2011, the disclosures of which are each hereby incorporated by reference herein in their entireties.

BACKGROUND

1. Technical Field

The present disclosure relates to flexible substrates and methods of manufacturing the same.

2. Description of the Related Art

Display devices display desired data through display panels. The data displayed by the display panel may be in various forms such as, for example, words, stabilized images, or moving pictures. The display devices may be used in various electronic devices, and various characters of the display devices may be required according to the forms of the electronic devices which are applied in connection with the display devices.

To satisfy the various demands, display devices with flexibility may be required. In other words, it may be required that the display devices are capable of being folded or rolled as the need arises.

Recently, to manufacture a flexible display device, research has been conducted for replacing a glass substrate with a plastic substrate. However, replacing the glass substrate with the plastic substrate when manufacturing flexible display devices may be difficult.

SUMMARY

Embodiments of the present invention may provide planarized flexible substrates.

Embodiments of the present invention may also provide methods of manufacturing the planarized flexible substrates.

According to an exemplary embodiment of the present invention, a flexible substrate includes a flexible mother substrate and a planarization layer on the flexible mother substrate. Here, the flexible mother substrate includes a transparent textile and a resin layer. The transparent textile includes a plurality of first transparent fibers and a plurality of second transparent fibers crossing the plurality of first transparent fibers, and the resin layer coats the transparent textile to fill a space between the first and second transparent fibers. The planarization layer includes an organic material having a curable contraction rate of no greater than about 20%.

The resin layer may include at least one of epoxy resin, phenol resin, phenol-epoxy resin, bismaleimide-triazine resin, polycarbonate, polyethersulfone, and polyetherimide.

A flatness of the planarization layer may be equal to or less than 100 nm.

According to an exemplary embodiment of the present invention, a method of manufacturing a flexible substrate may include: mounting a substrate on a first supporting substrate, forming an organic material layer on the substrate; planarizing the organic material layer by pressuring the organic material layer with a second supporting substrate opposite to the first supporting substrate and curing the organic material layer.

The organic material layer may include an organic material having a curable contraction rate of no greater than about 20%.

The organic material may include at least one of 2(2-ethoxyethoxy) ethyl acrylate, and polyethylene glycol diacrylate.

According to an exemplary embodiment of the present invention, a method of manufacturing a flexible substrate may include: mounting a substrate on a supporting substrate, forming an organic material layer on the substrate, planarizing the organic material layer by pressuring the organic material layer with a mold disposed opposite to the supporting substrate and curing the organic material layer. The organic material layer may include an organic material having a curable contraction rate of no greater than about 20%.

The mold may include a flat portion having a flat surface, and a sidewall portion surrounding the flat portion. A thickness of the organic material layer may be controlled by a height of the sidewall portion.

According to embodiments of the present invention, a method for manufacturing a flexible substrate is provided. The method includes forming a transparent textile including a plurality of first transparent fibers and a plurality of second transparent fibers intersecting with the plurality of first transparent fibers, soaking the transparent textile with a polymer resin in a liquid state in a container, removing the transparent textile from the container and coating the transparent textile with a resin layer such that the resin layer fills a space between the first and second transparent fibers to thereby form a flexible mother substrate. The method further includes disposing the flexible mother substrate on a first supporting substrate having a substantially flat surface, coating an organic material on the flexible mother substrate, curing the organic material to form an organic material layer on the flexible mother substrate, performing a soft bake process on the organic material layer to remove a solvent in the organic material layer.

In addition, the method further includes forming a desorption layer on a second supporting substrate, bonding the first supporting substrate and the second supporting substrate to each other such that the organic material layer and the desorption layer face each other and a surface of the organic material layer contacting the desorption layer is planarized by the bonding process, curing the organic material layer by a hard bake process to form a planarization layer between the desorption layer and the flexible mother substrate and removing the desorption layer from the second supporting substrate to thereby separate the second supporting substrate from the first supporting substrate and form a flexible substrate which includes the flexible mother substrate and the planarization layer which are sequentially stacked on the first supporting substrate.

BRIEF DESCRIPTION OF THE DRAWINGS

Exemplary embodiments of the present invention will become more apparent in view of the attached drawings and accompanying detailed description.

DETAILED DESCRIPTION

Figure 1:
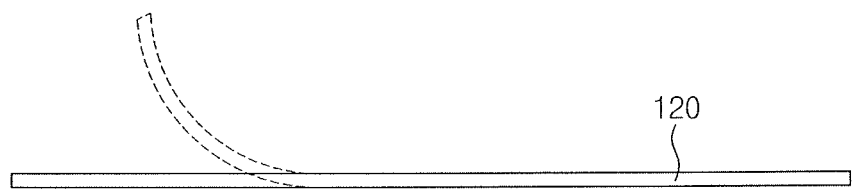
FIG. 1 is a schematic cross-sectional view illustrating a flexible mother substrate according to an exemplary embodiment of the present invention.
Figure 2A:
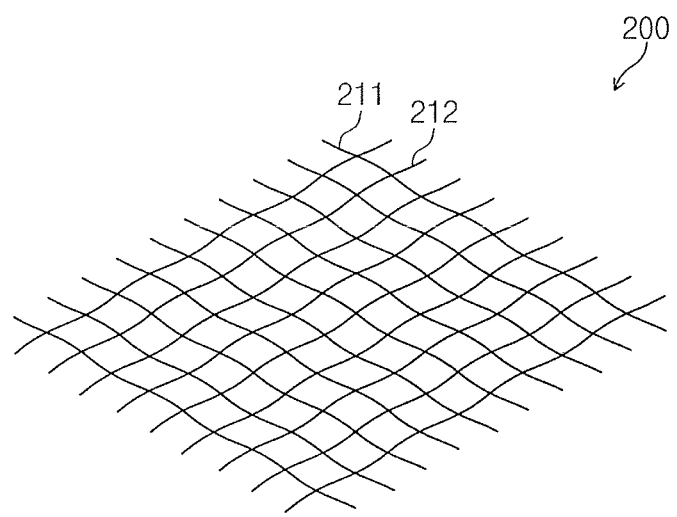
FIGS. 2A through 2C are schematic views illustrating a method of manufacturing a flexible mother substrate according to an exemplary embodiment of the present invention.
Figure 2B:
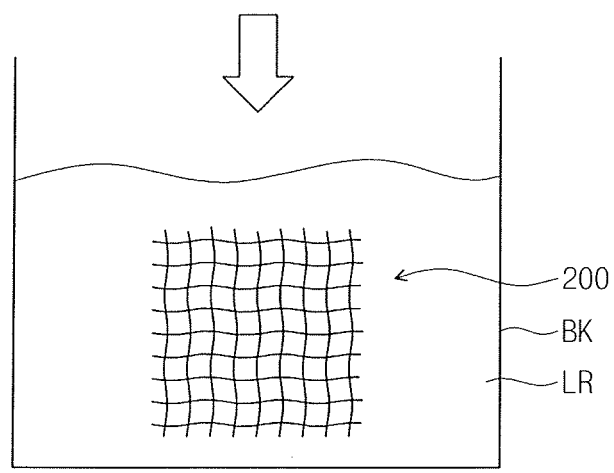
Figure 2C:
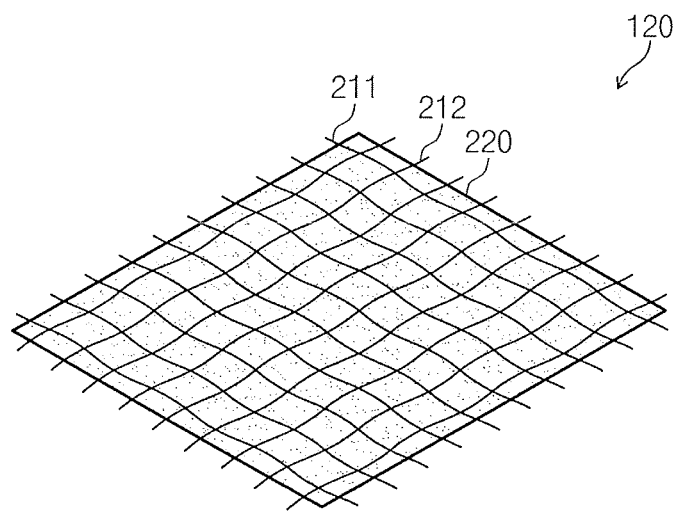
Figure 3:
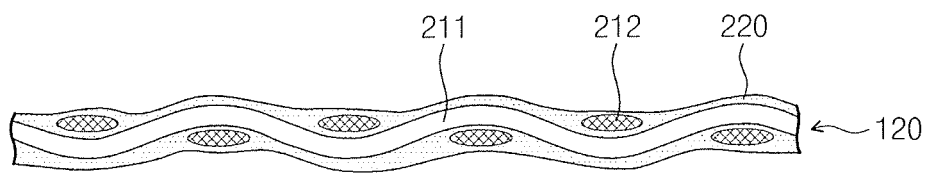
FIG. 3 is enlarged cross-sectional view of the flexible mother substrate manufactured by the method of FIGS. 2A through 2C.

Hereinafter, a flexible mother substrate used in a method of manufacturing a flexible substrate according to an exemplary embodiment of the present invention will be explained with reference to FIGS. 1, 2A, 2B, 2C, and 3. FIG. 1 is a schematic cross-sectional view illustrating a flexible mother substrate, and FIGS. 2A through 2C are schematic views illustrating a method of manufacturing a flexible mother substrate in accordance with an exemplary embodiment of the present invention. FIG. 3 is enlarged cross-sectional view of the flexible mother substrate manufactured by the method of FIGS. 2A through 2C.

Referring to FIG. 1, a flexible mother substrate 120 may be, for example, a transparent substrate and may be flexible. For example, the flexible mother substrate 120 may be a film folded or rolled by an external force.

The flexible mother substrate 120 may include, for example, a transparent fiber therein. The transparent fiber may be, for example, a glass fiber. The transparent fiber may be woven to form a transparent textile. For example, the transparent textile may be formed by weaving a yarn. The yarn may be made by twisting glass filaments into a strand. The weaving method may be one of, for example, a plain weave, a twill weave, a satin weave, a line weave, and imitation leno weave. However, exemplary embodiments of the present invention are not limited thereto. The flexible mother substrate 120 may be manufactured by, for example, soaking a glass fiber, a yarn using the glass fiber, or textile in a transparent resin. The flexible mother substrate 120 may be, for example, a thin layer, a textile formed by weaving a fiber, or a structure stacking textiles or thin layers.

The flexible mother substrate 120 may be formed using, for example, an organic resin. The organic resin may be a thermosetting resin such as, for example, epoxy resin, phenol resin, phenol-epoxy resin, and/or bismaleimide-triazine resin, or a thermoplastic resin such as polycarbonate, polyethersulfone and/or polyetherimide.

The flexible mother substrate 120 including the transparent textile formed using the transparent fiber will be described, hereinafter.

Referring to FIGS. 1 and 2A, the flexible mother substrate 120 may provide a base structure for forming a flexible substrate. The flexible substrate may be modified by an external force. However, the flexible substrate should support its structure against a predetermined external force.

The flexible mother substrate 120 may include, for example, a transparent textile 200 formed by weaving transparent fibers for having an optical characteristic and a mechanical characteristic of the flexible substrate. Here, the mechanical characteristic means thermal dimension stability. As a material such as plastic has a large coefficient of thermal expansion (CTE), the stability of a flexible substrate formed by the material may decrease. However, because the flexible mother substrate 120 is formed using the transparent fibers such as, for example, the glass fibers, the CTE of the flexible substrate may be reduced. In other words, because the CTE of the glass fibers is relatively smaller, the CTE of the flexible substrate can be reduced as the density of the glass fibers becomes higher. Thus, the stability of the flexible substrate can be increased. Here, the glass fibers may be woven in textile form, thereby controlling the CTEs of the flexible substrate in four directions to be substantially equal to each other. The flexible mother substrate 120 is referred to as a fiber reinforced plastic.

A method of manufacturing the flexible mother substrate 120 in accordance with an exemplary embodiment will be described, hereinafter.

Referring to FIG. 2A again, first transparent fibers 211 extending in a transverse direction relative to second transparent fibers 212 extending in a longitudinal direction may be woven together to form a transparent textile 200. The first and second transparent fibers 211 and 212 may be, for example, glass fibers. The transparent textile 200 may be formed of, for example, a transparent material to have an optical characteristic transmitting light. Intervals of the first transparent fibers 211 and the second transparent fibers 212 may be controlled for the optical characteristic and the mechanical characteristic of the transparent textile 200.

Referring to FIG. 2B, the transparent textile 200 may be soaked in a liquid resin LR. The liquid resin LR may be, for example, a polymer resin and may be kept within a container BK in liquid state. After the transparent textile 200 is completely soaked in the container BK, the transparent textile 200 may be pulled from the container BK to form the flexible mother substrate 120.

Referring to FIGS. 2C and 3, the transparent textile 200 may be coated with, for example, a resin layer 220. The resin layer 220 may be cured to form the flexible mother substrate 120. At this time, the resin layer 220 may be formed of, for example, a transparent resin transmitting light. Here, the resin layer 220 may be formed using, for example, an organic resin. The organic resin may be, for example, a thermosetting resin such as epoxy resin, phenol resin, phenol-epoxy resin, and/or bismaleimide-triazine resin, or a thermoplastic resin such as polycarbonate, polyethersulfone and/or polyetherimide.

Additionally, as the transparent textile 200 is fully coated with the resin layer 220, the resin layer 220 may exist between the first and second transparent fibers 211 and 212. In other words, the resin layer 220 fills a space between the first and second transparent fibers 211 and 212 constituting the transparent textile 200, such that the flexible mother substrate 120 may get a desired mechanical characteristic.

A surface of the flexible mother substrate 120 may have significant roughness. For example, the surface of the flexible mother substrate 120 may have a profile formed by the first and second transparent fibers 211 and 212. In the flexible mother substrate 120, a portion in which the first and second transparent fibers 211 and 212 are disposed may be, for example, convex relative to a portion of the flexible mother substrate 120 in which the first and second transparent fibers 211 and 212 are not disposed. That is, the flexible mother substrate 120 may have a wavy surface due to the first and second transparent fibers 211 and 212. Even though the space between the first and second transparent fibers 211 and 212 is filled with the resin layer 220, the space may be relatively concave.

A method of manufacturing a flexible substrate according to an exemplary embodiment of the present invention will be described with reference to FIGS. 4A through 4F. FIGS. 4A through 4F are schematic cross-sectional views illustrating a method of manufacturing a flexible substrate according to an exemplary embodiment of the present invention.

Figure 4A:
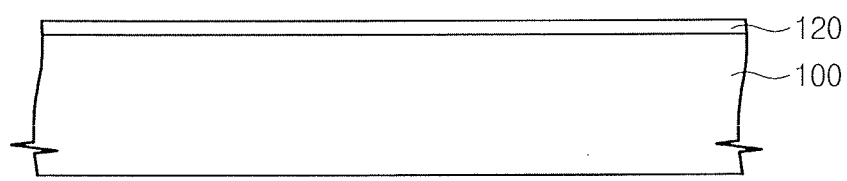
FIGS. 4A through 4F are schematic cross-sectional views illustrating a method of manufacturing a flexible substrate according to an exemplary embodiment of the present invention.

Referring to FIG. 4A, the flexible mother substrate 120 described above may be disposed on a first supporting substrate 100.

The first supporting substrate 100 may be formed of, for example, a transparent material. For example, the first supporting substrate 100 may be a glass substrate. The glass substrate used for the first supporting substrate 100 may be, for example, a non-alkali glass substrate. Examples of the non-alkali glass material which may be used in accordance with the present exemplary embodiment includes but is not limited to aluminosilicate glass, aluminoborosilicate glass, barium borosilicate glass, or the like. Moreover, the first supporting substrate 100 can instead be formed of, for example, quartz or sapphire.

Alternatively, the first supporting substrate 100 may be a non-transparent substrate. For example, the non-transparent substrate may be formed of plastic or metallic foils such as stainless steel foils. The first supporting substrate 100 may have, for example, a flat surface. The first supporting substrate 100 may support the flexible mother substrate 120, so that the flexible mother substrate 120 may maintain the flatness thereof. Even though not shown, a sacrificial layer may be interposed between the first supporting substrate 100 and the flexible mother substrate 120. Due to the sacrificial layer, the flexible mother substrate 120 may be readily separated from the first supporting substrate 100 in a subsequent process.

Figure 4B:
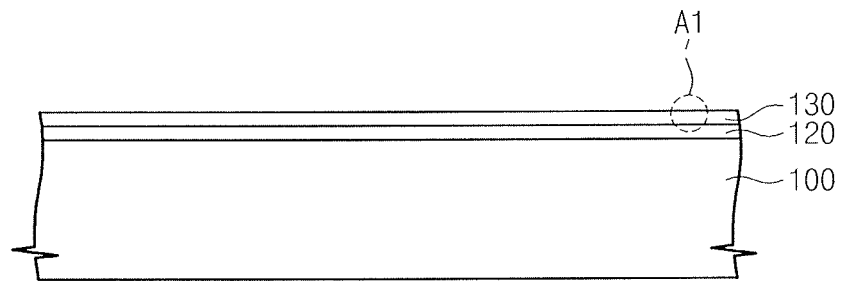

Referring to FIG. 4B, an organic material may be coated on the flexible mother substrate 120 to form an organic material layer 130.

After the organic material is cured, the organic material may be transparent or non-transparent. Transparency of the organic material may be selected depending on kinds of devices using the organic material and the flexible mother substrate 120. The organic material may be cured by light. For example, the organic material may be a photocurable resin such as HDDA(1,6-hexanediol-diacrylate), novolak resin), and HEBDM(bis(hydroxyethyl)bisphenol-A dimethacrylate). For example, the organic material may be a material having a photo curable contraction rate of about 20% or less. The organic material may include monomers. The monomers of the organic material may be polymerized, so that the organic material may be cured. At this time, weak bonds having long bond lengths may be transformed into strong bonds having short bond lengths. Thus, a cured layer is contracted. The curable contraction rate of the organic material may be determined depending on a functional group and a monomer weight of the organic material. For example, the organic material may be at least one of 2(2-ethoxyethoxy) ethyl acrylate, and polyethylene glycol diacrylate.

Alternatively, the organic material may be cured by, for example, heat. For example, the organic material may include phenol resin, epoxy resin, silicon resin, acetate, and/or polyimide. For example, the organic material may be a material having a thermal curable contraction rate of about 20% or less.

Accordingly, the organic material may be photocurable or thermosetting.

Figure 5A:
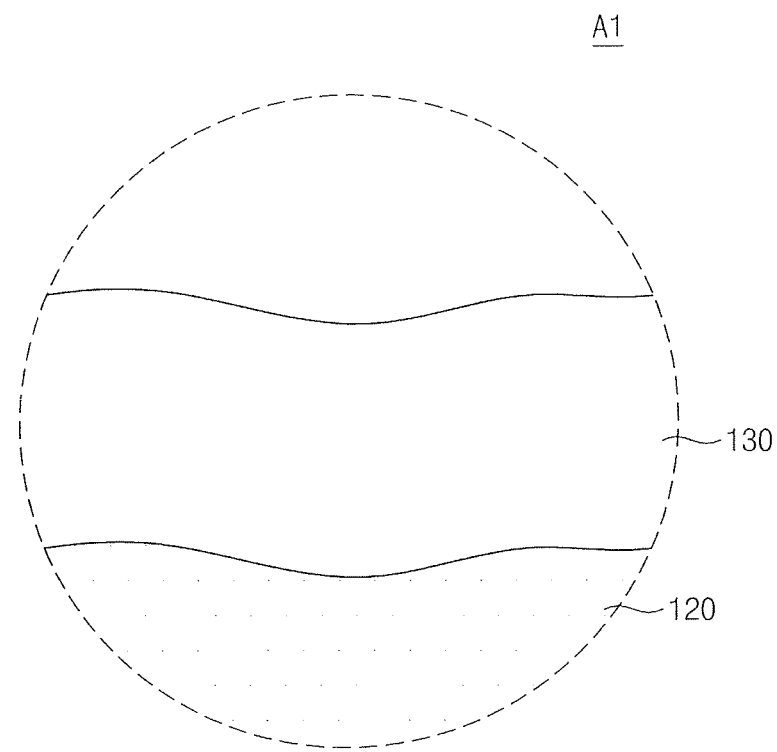
FIG. 5A is an enlarged view of a portion 'A1' of FIG. 4B.
Figure 5B:
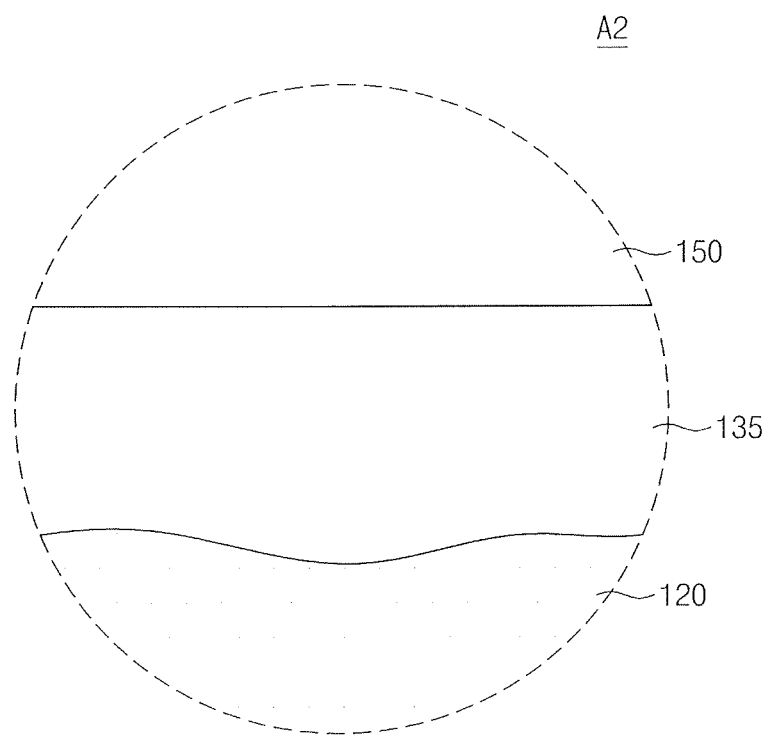
FIG. 5B is an enlarged view of a portion 'A2' of FIG. 4E.

The organic material may be provided in, for example, a liquid state. The organic material may be diluted in a solvent to be provided. The organic material layer 130 may be formed by a method such as, for example, a spin coating method, a slit coating method, a spray coating method, and/or a ink-jet coating method. The organic material layer 130 may have a thickness sufficient to fill a concave region of the flexible mother substrate 120. In an embodiment, as illustrated in FIG. 5A, the organic material layer 130 may be coated, for example, along the surface profile of the flexible mother substrate 120 to be non-flat.

The viscosity and the coating amount of the organic material may influence the thickness of the organic material layer 130. In other words, the surface of the flexible mother substrate 120 may be more smoothly planarized as the viscosity of the organic material becomes greater, and the organic material layer 130 may be formed thicker due to the viscosity. However, when the organic material layer 130 is thicker, the flexible mother substrate 120 may be bent by a stress of the organic material layer 130. Thus, the thickness of the organic material layer 130 may be controlled to reflect that phenomenon.

Figure 4C:
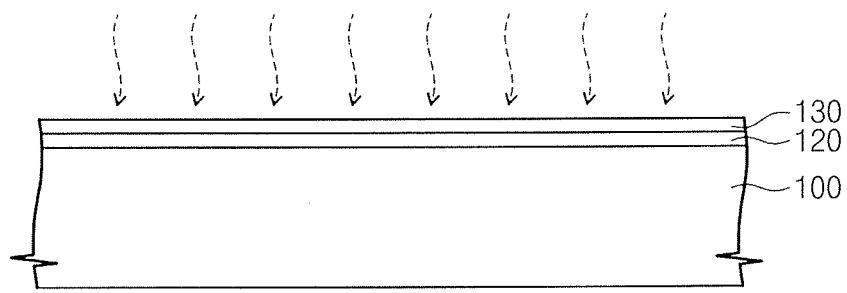

Referring to FIG. 4C, a soft bake process may be performed on the organic material layer 130. The solvent in the organic material layer 130 may be removed by the soft bake process.

Figure 4D:
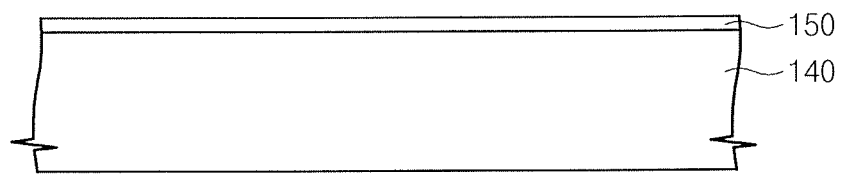

Referring to FIG. 4D, a second supporting substrate 140 provided with a desorption layer 150 may be prepared. The desorption layer 150 may be formed on a surface of the second supporting substrate 140. The second supporting substrate 140 having a flat surface may be formed of a material transmitting light such as, for example, ultra violet (UV) light. Additionally, the second supporting substrate may be formed of a material transmitting heat. For example, the second supporting substrate 140 may be a glass substrate. The glass substrate used for second supporting substrate 140 may be, for example, a non-alkali glass substrate. Examples of the non-alkali glass material which may be used in accordance with the present exemplary embodiment includes but is not limited to aluminosilicate glass, aluminoborosilicate glass, barium borosilicate glass, or the like. Also, the second supporting substrate 140 can instead be formed of, for example, a quartz substrate or a sapphire substrate.

The desorption layer 150 may be formed of an inorganic material and/or an organic material. The desorption layer 150 may be formed of a material which is removable by a laser. At this time, the desorption layer 150 may be formed of a material removable by, for example, a power less than an ablation power for removing the organic material layer 130. In other words, when the desorption layer 150 is removed by a laser beam, the organic material layer 130 may not be removed. It is noted that alternatively, the second supporting substrate 140 may instead be prepared before or simultaneously with the preparation of the first supporting substrate 100.

Figure 4E:
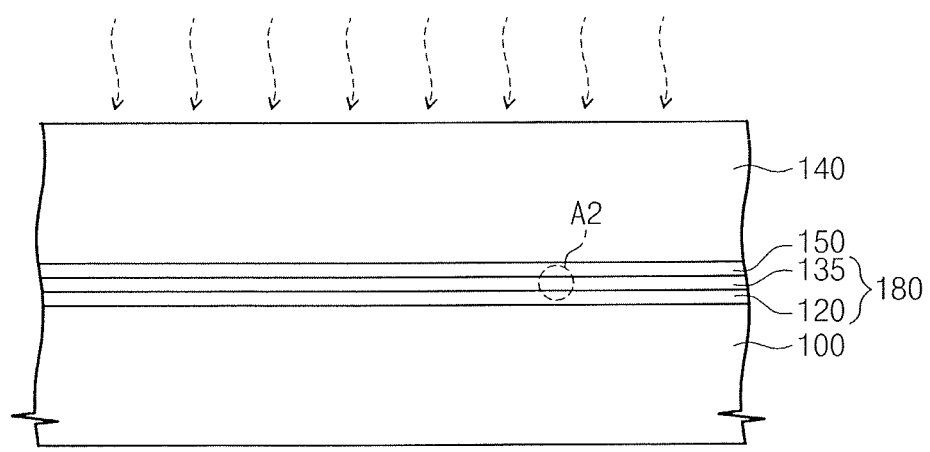

Referring to FIGS. 4C through 4E, a bonding process may be performed to bond the first supporting substrate 100 to the second supporting substrate 140 in the state that the organic material layer 130 and the desorption layer 150 face each other. The bonding process may be performed in a vacuum, and the first supporting substrate 100 and the second supporting substrate 140 may be pressed together.

The bonding process may be performed by a means such as, for example, a roller and/or an air cushion. Thus, air bubbles, which may exist between the first and second supporting substrates 100 and 140, may be removed. Additionally, the first and the second supporting substrates 100 and 140 are pressed together, so that the organic material layer 130 between the first and second supporting substrates 100 and 140 may be planarized. In other words, the organic material layer 130 may be fluid between the first and second supporting substrates 100 and 140, so that a surface of the organic material layer 130 contacting the desorption layer 150 may be planarized. Thus, as illustrated in 5B, even though the organic material layer 130 is non-uniformly coated by the viscosity of the organic material constituting the organic material layer 130, the surface of the organic material layer 130 contacting the desorption layer 150 may be planarized by the bonding process. Here, the flatness of the organic material layer 130 may be, for example, equal to or less than about 100 nm.

Subsequently, the organic material layer 130 may be cured by a hard bake process to form a planarization layer 135. The planarization layer 135 may have rigidity autonomously by the hard bake process. In an embodiment, to increase the flatness of the organic material layer 130, the first and second supporting substrates 100 and 140 may be pressed together during the hard bake process.

As described above, the soft bake process and the hard bake process may be performed. However, a photocurable process besides the bake processes may be selectively or abreast performed. The organic material may be selected depending on a curable process.

Figure 4F:
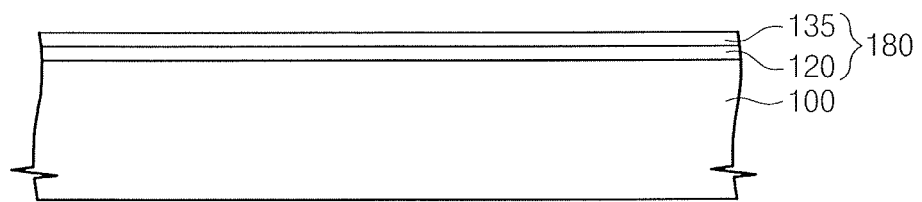

Referring to FIG. 4F, a removing process may be performed to remove the desorption layer 150. The removing process may be performed using, for example, a laser. The desorption layer 150 may be selectively removed by the removing process to separate the second supporting substrate 140 from the first supporting substrate 100. As a result, a flexible substrate 180 may be formed. The flexible substrate 180 includes the flexible mother substrate 120 and the planarization layer 135 which are sequentially stacked on the first supporting substrate 100.

At least one surface of the flexible substrate 180 may include the planarization layer 135. Processes may be performed on the planarization layer 135 to form devices such as, for example, a thin film transistor and/or a pixel electrode. In an embodiment, the processes described with reference to FIGS. 4A through 4F may be performed on another surface of the flexible substrate 180.

Figure 6A:
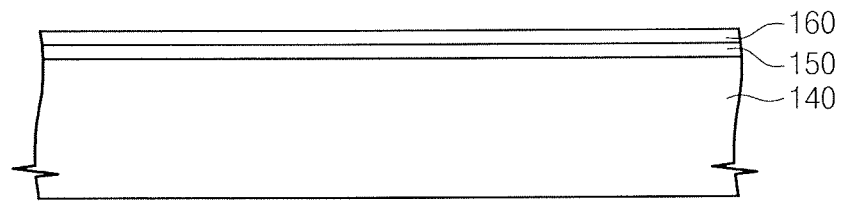
FIGS. 6A through 6C are schematic cross-sectional views illustrating a method of manufacturing a flexible substrate according to an exemplary embodiment of the present invention.
Figure 6B:
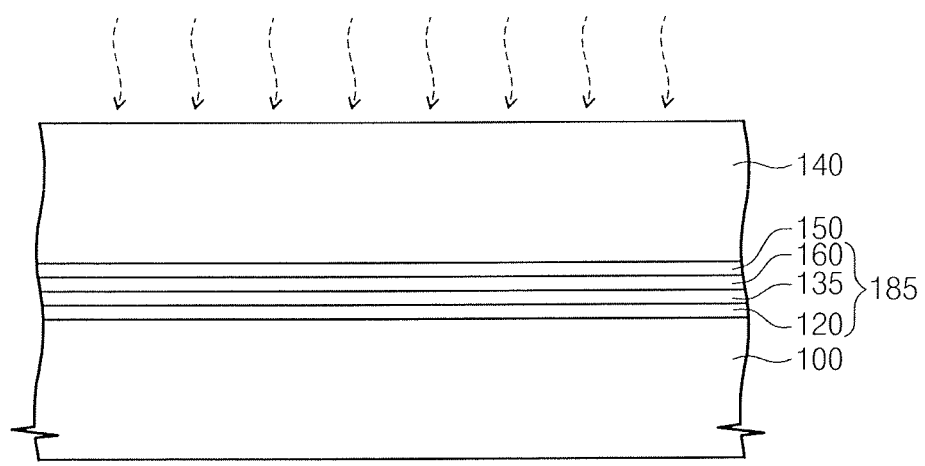
Figure 6C:
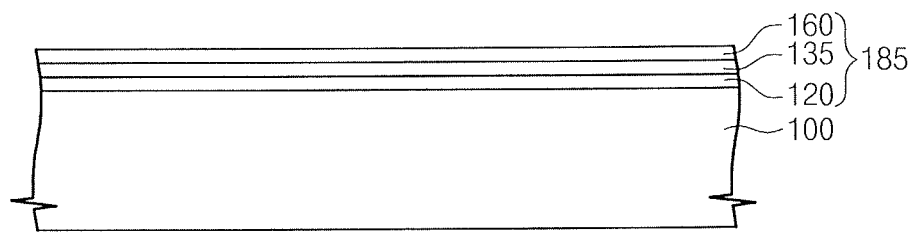

A method of manufacturing a flexible substrate according to an exemplary embodiment of the present invention will be described with reference to FIGS. 6A through 6C. FIGS. 6A through 6C are schematic cross-sectional views illustrating a method of manufacturing a flexible substrate according to an exemplary embodiment of the present invention. The same descriptions as described above will be omitted or mentioned briefly.

Referring to FIG. 6A, a barrier layer 160 may be formed on the product of FIG. 4D. Thus, the second supporting substrate 140 including the desorption layer 150 and the barrier layer 160 sequentially stacked on a surface thereof may be prepared. The second supporting substrate 140 may have, for example, a flat surface and be formed of a material transmitting light such as ultra violet (UV) light. Additionally, the second supporting substrate 140 may be formed of a material transmitting heat. For example, the second supporting substrate 140 may be a glass substrate. The glass substrate used for the second supporting substrate 140 may be, for example, a non-alkali glass substrate. Examples of the non-alkali glass material which may be used in accordance with the present exemplary embodiment includes but is not limited to aluminosilicate glass, aluminoborosilicate glass, barium borosilicate glass, or the like. Further, the second supporting substrate 140 can also be formed of, for example, a quartz substrate or a sapphire substrate.

The desorption layer 150 may be formed of an inorganic material and/or an organic material. The desorption layer 150 may be formed of a material which is removable by a laser. At this time, the desorption layer 150 may be formed of a material which is removable by, for example, a power less than an ablation power for removing the barrier layer 160.

The barrier layer 160 may be formed of a material having high light transmittance and low vapor permeability. For example, the barrier layer 160 may be formed of an inorganic material such as silicon nitride. Alternatively, the barrier layer 160 may also be formed of other inorganic materials such as, for example, silicon oxide, silicon oxynitride, silicon carbide, aluminum oxide, hafnium oxide, or tantalum oxide.

The processes described with reference to FIGS. 4A through 4C may be performed again, so that the first supporting substrate 100 including the flexible mother substrate 120 and the organic material layer 130 sequentially stacked on a surface thereof may be prepared. The first supporting substrate 100 and the second supporting substrate 140 may be prepared simultaneously or sequentially. A manufacturing order of the first and second supporting substrates 100 and 140 may be changed.

Referring to FIGS. 6A and 6B, a bonding process may be performed to bond the first supporting substrate 100 to the second supporting substrate 140, so that the organic material layer 130 and the barrier layer 160 may face each other. The bonding process may be performed in a vacuum, and the first supporting substrate 100 and the second supporting substrate 140 may be pressed together.

The bonding process may be performed by using, for example, a roller and/or an air cushion. Thus, air bubbles, which may exist between the first and second supporting substrates 100 and 140, may be removed. Additionally, the first and the second supporting substrates 100 and 140 are pressed together, so that the organic material layer 130 between the first and second supporting substrates 100 and 140 may be planarized. In other words, the organic material layer 130 may be fluid between the first and second supporting substrates 100 and 140, so that a surface of the organic material layer 130 contacting the barrier layer 160 may be planarized. Thus, even though the organic material layer 130 is non-uniformly coated by the viscosity of the organic material constituting the organic material layer 130, the organic material layer 130 may be planarized by the bonding process.

Subsequently, the organic material layer 130 may be cured by, for example, a hard bake process to form a planarization layer 135. The planarization layer 135 may have rigidity autonomously by the hard bake process.

As described above, the soft bake process and the hard bake process may be performed. However, a photocurable process besides the bake processes may be selectively or abreast performed. The organic material may be selected depending on a curable process.

Referring to FIG. 6C, a removing process may be performed to remove the desorption layer 150. The removing process may be performed using, for example, a laser. The desorption layer 150 may be selectively removed by the removing process to separate the second supporting substrate 140 from the first supporting substrate 100. As a result, a flexible substrate 185 may be formed which includes the flexible mother substrate 120, the planarization layer 135, and the barrier layer 160 which are sequentially stacked on the first supporting substrate 100.

Figure 7A:
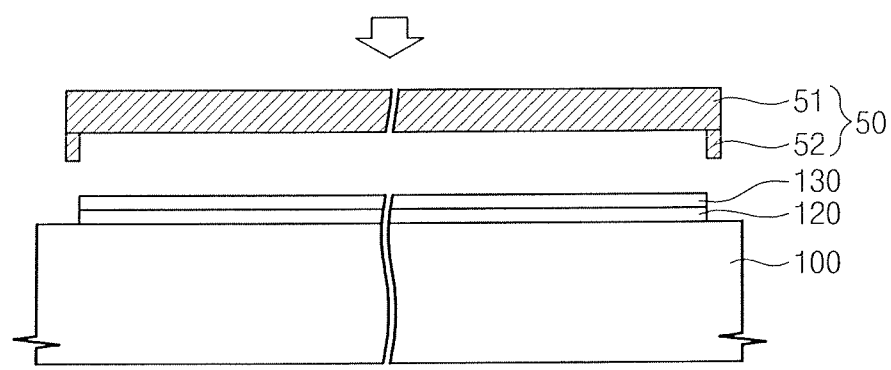
FIGS. 7A through 7C are schematic cross-sectional views illustrating a method of manufacturing a flexible substrate according to an exemplary embodiment of the present invention.
Figure 7B:
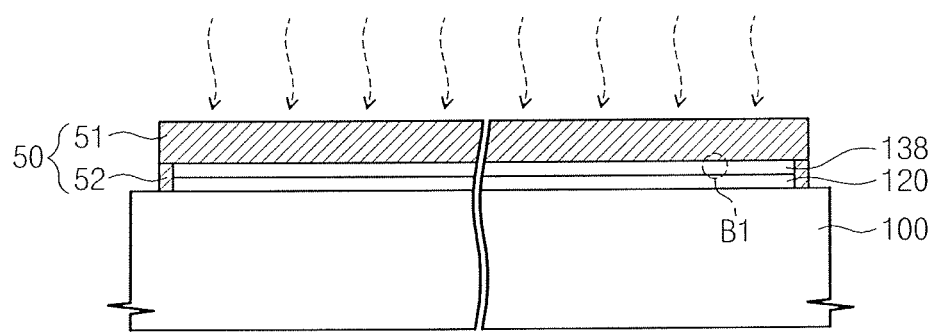
Figure 7C:
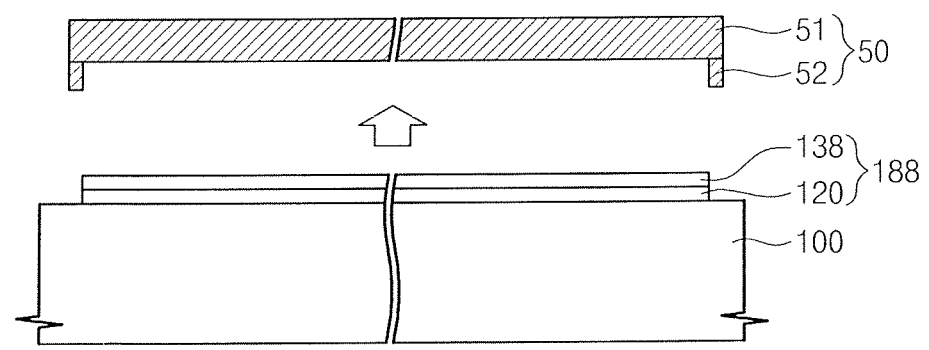

Hereinafter, a method of manufacturing a flexible substrate according to an exemplary embodiment of the present invention will be described with reference to FIGS. 7A through 7C. FIGS. 7A through 7C are schematic cross-sectional views illustrating a method of manufacturing a flexible substrate according to an exemplary embodiment of the present invention;

Referring to FIG. 7A, the processes described with reference to FIGS. 4A and 4B may be performed to form the flexible mother substrate 120 and the organic material layer 130 sequentially stacked on the first supporting substrate 100. The organic material layer 130 may be pre-baked as the need arises.

A mold 50 for planarizing the organic material layer 130 may be prepared. The mold 50 may include, for example, a flat portion 51 having a flat surface, and a sidewall portion 52 surrounding the flat portion 51. In other words, the mold 50 may have, for example, a box shape of which a side is opened by the flat portion 51 and the sidewall portion 52. At this time, the flat portion 51 may be formed of a material transmitting light such as, for example, UV light irradiated in subsequent process, and/or heat. For example, the flat portion 51 may be formed of a transparent material such as, for example, a glass substrate. Alternatively, the flat portion 51 may be formed of other transparent materials including, for example, a sapphire substrate or a quartz substrate.

The sidewall portion 52 surrounding the flat portion 51 may control a thickness of the organic material layer 130. That is, the thickness of the organic material layer 130 may be controlled according to, for example, a coating amount and a height of the sidewall portion 52.

Referring to FIG. 7B, the organic material layer 130 may be pressured by the mold 50 to be planarized. The organic material layer 130 may not be uniformly coated on the flexible mother substrate 120 by the viscosity of the organic material. However, if an organic material having low viscosity is used, the flexible mother substrate 120 should be coated several times. If the coating process is repeatedly performed several times, the flexible mother substrate 120 may be bent by an autonomous stress of a coating layer. Thus, the organic material having a suitable viscosity may be coated on the flexible mother substrate 120 and then the organic material may be pressured using the mold 50, thereby planarizing the organic material layer 130.

Figure 8:
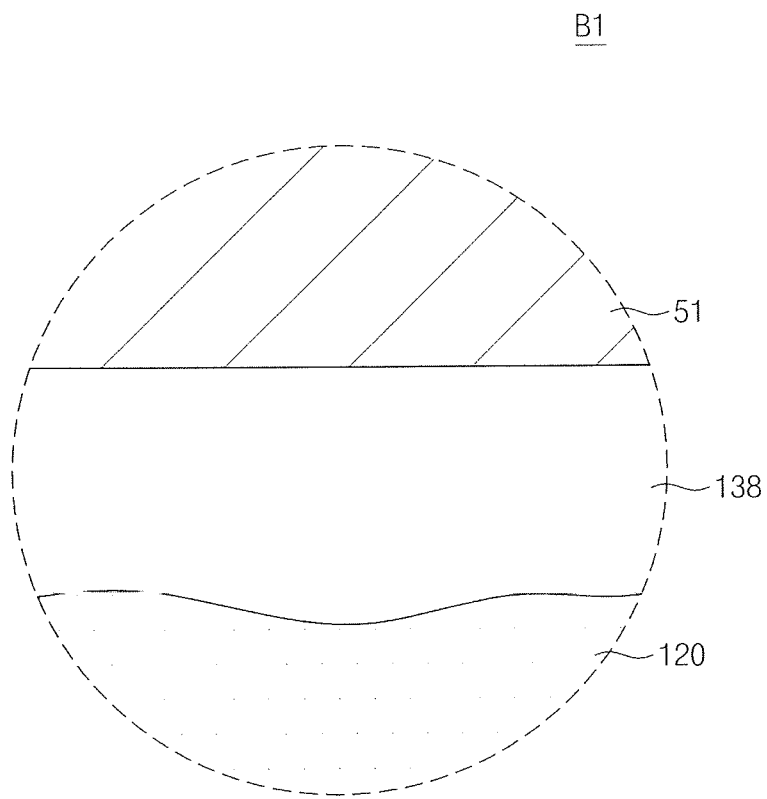
FIG. 8 is an enlarged view of a portion 'B1' of FIG. 7B.

The organic material layer 130 may be cured by a curable process to form a planarization layer 138. As the organic material layer 130 may be formed by coating the organic material in a liquid state not to have a self-rigidity, the curable process is performed. As illustrated in FIG. 8, a surface of the planarization layer 138 may become flat along a surface profile of the flat portion 51.

The curable process may be, for example, a UV treatment process or a thermal treatment process. At this time, the curable process may be, for example, one of a UV irradiation or a thermal treatment. When the organic material layer 130 is formed of a photocurable resin, irradiation of a visible light or the UV light may be performed. Alternatively, when the organic material layer 130 is formed of a thermosetting resin, the heat treatment may be performed. Additionally, the heat treatment and the UV irradiation may be performed abreast according to a kind of the organic material constituting the organic material layer 130.

Referring to FIG. 7C, the mold 50 may be separated from the first supporting substrate 100. Thus, a flexible substrate 188 may include the flexible mother substrate 120 and the planarization layer 138 sequentially stacked on the first supporting substrate 100.

In the above embodiment, the planarization layer 138 is formed on one surface of the flexible substrate 188. However, the planarization layer 138 may also be formed on another surface of the flexible substrate 188. Thus, the processes described with reference to FIGS. 7A through 7C may also be performed on another surface of the flexible substrate 188 as the need arises.

Figure 9:
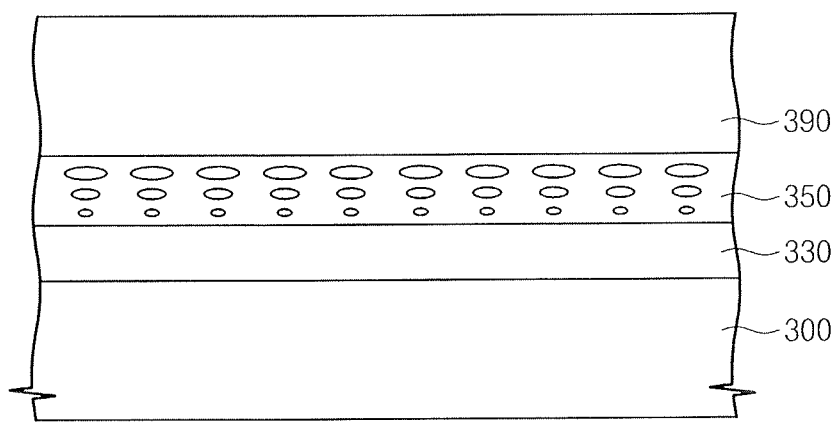
FIG. 9 is a schematic cross-sectional view illustrating a liquid crystal display device including a flexible substrate according to an exemplary embodiment of the present invention.

Hereinafter, a display device including a flexible substrate according to an exemplary embodiment of the present invention will be described with reference to FIG. 9. FIG. 9 is a schematic cross-sectional view illustrating a liquid crystal display device including a flexible substrate according to an exemplary embodiment of the present invention.

Referring to FIG. 9, a liquid crystal display device may include, for example, an array substrate 300, an opposite substrate 390 facing the array substrate 300, a liquid crystal layer 350 interposed between the array substrate 300 and the opposite substrate 390, and an array layer 330 formed on the array substrate 300. The array substrate 300 and/or the opposite substrate 390 may be, for example, one of the flexible substrates 180, 185, or 188 described with reference to FIG. 4F, 6C, or 7C. Here, surfaces of the array substrate 300 and the opposite substrate 390, on which the planarization layers 135, or 138 are formed, may be opposite to each other.

Even though not shown, the array layer 330 may include gate lines (now shown) and data lines (not shown) which extend to cross each other on the array substrate 300. The gate lines and the data lines may be formed by, for example, performing a deposition process of a conductive material on the flexible substrate of FIG. 4F, 6C, or 7C and a patterning process of the conductive material. Pixel regions (not shown) may be defined by the gate lines and the data lines, and pixels corresponding to the pixel regions may be provided.

Each of the pixels may include a thin film transistor (TFT, not shown) and a pixel electrode (not shown). Here, a gate electrode of the TFT may be connected to a corresponding gate line, a source electrode of the TFT may be connected to a corresponding data line, and a drain electrode of the TFT may be connected to the pixel electrode.

The opposite substrate 390 may include, for example, RGB color pixels respectively corresponding to the pixels, and a common electrode formed on the RGB color pixel and facing the pixel electrode.

The liquid crystal layer 350 may be arranged in a predetermined direction by an electric field generated between the pixel electrode and the common electrode, so that a transmittance of a light provided from an external light source may be controlled.

Figure 10:
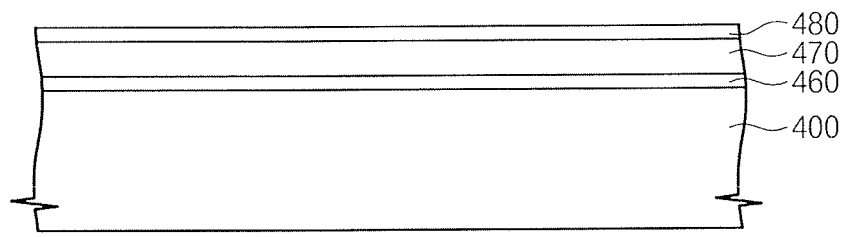
FIG. 10 is a schematic cross-sectional view illustrating an organic electroluminescence display device including a flexible substrate according to an exemplary embodiment of the present invention.

A display device including a flexible substrate according to an exemplary embodiment of the present invention will be described with reference to FIG. 10. FIG. 10 is a schematic cross-sectional view illustrating an organic electroluminescence display device including a flexible substrate according to an exemplary embodiment of the present invention.

Referring to FIG. 10, an organic electroluminescence display device may include, for example, a flexible substrate 400, a pixel electrode 460, an organic layer 470, and an upper electrode 480. The pixel electrode 460, the organic layer 470, and the upper electrode 480 may be sequentially stacked on the flexible substrate 400. The flexible substrate 400 may be, for example, one of the flexible substrates 180, 185, 188 described with reference to FIG. 4F, 6C, or 7C. Here, the pixel electrode 460, the organic layer 470, and the upper electrode 480 may be sequentially stacked on a surface of the flexible substrate 400 on which the planarization layer 135 or 138 is formed.

The pixel electrode 460 and the upper electrode 480 may be a transparent or not-transparent conductive layer. The pixel electrode 460 may provide holes to the organic layer 470, and the upper electrode 480 may provide electrons to the organic layer 470. Alternatively, the pixel electrode 460 may provide electrons to the organic layer 470, and the upper electrode 480 may provide holes to the organic layer 470. The organic layer 470 may be single-layered or multi-layered. The holes and the electrons may be combined with each other to emit light toward the outside.

In addition, a thin film transistor may further be provided on the flexible substrate 400. Additionally, an insulating layer covering the thin film transistor may further formed between the flexible substrate 400 and the pixel electrode 460. The thin film transistor may be provided in plural. For example, the thin film transistors may include a switching transistor and a driving transistor. The pixels may be selected individually by the switching transistor, and the pixel may be driven by the driving transistor.

Additionally, a packaging structure may further be provided. The packaging structure may be opposite to the flexible substrate 400, and protect the pixel electrode 460, the organic layer 470, and the upper electrode 480.

Figure 11:
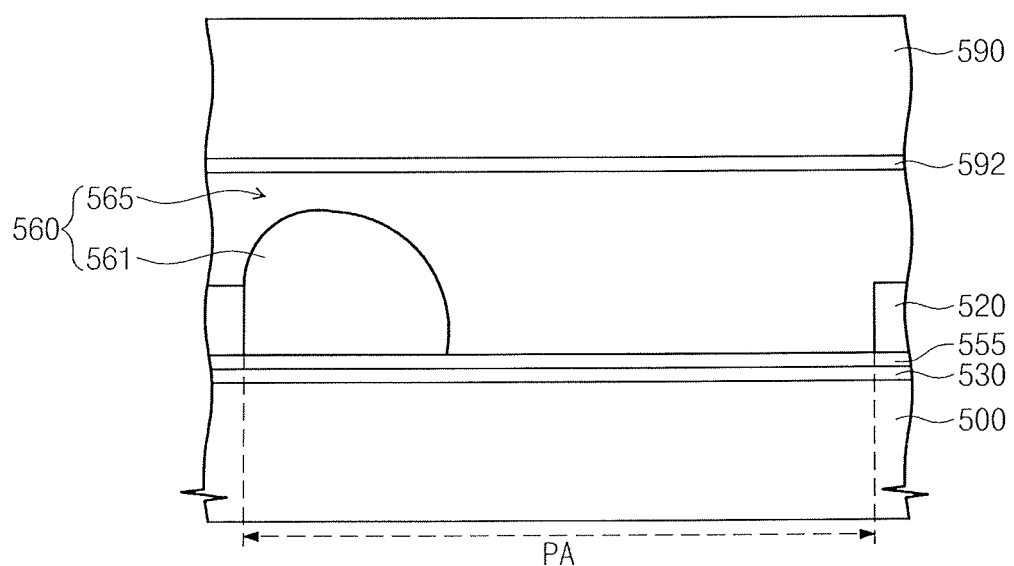
FIG. 11 is a schematic cross-sectional view illustrating an electrowetting display device including a flexible substrate according to an exemplary embodiment of the present invention.

A display device including a flexible substrate according to an exemplary embodiment of the present invention will be described with reference to FIG. 11. FIG. 11 is a schematic cross-sectional view illustrating an electrowetting display device including a flexible substrate according to an exemplary embodiment of the present invention.

Referring to FIG. 11, an electrowetting display device may include, for example, a first substrate 500 and a second substrate 590 opposite to each other, and a fluid layer 560 between the first and second substrates 500 and 590. At least one of the first substrate 500 and the second substrate 590 may be one of the flexible substrates 180, 185, or 188 described with reference to FIG. 4F, 6C, or 7C. Surfaces of the first and second substrates 500 and 590, on which the planarization layers 135 or 138 are formed, may be opposite to each other.

A pixel wall 520 may be disposed on the first substrate 500. A pixel region PA may be defined by the pixel wall 520. The pixel wall 520 may include, for example, an organic material. The organic material of the pixel wall 520 may be, for example, photocurable material. The pixel wall 520 may include a top surface facing the second substrate 590. The top surface may be, for example, a hydrophilic treated surface.

A pixel electrode 530 may be disposed on the pixel region PA. The pixel electrode 530 may be a transparent conductive layer or a reflection conductive layer. Alternatively, the pixel electrode 530 may include all of the transparent conductive layer and the reflection conductive layer.

A hydrophobic insulating layer 555 may be disposed on the pixel electrode 530. For example, the hydrophobic insulating layer 555 may include a hydrophobic material such as, for example, a polytetrafluoroethylene resin (PTFE), polytetrafluoroethylene-perfluoroalkoxyethylen copolymer resin (PFA) or poly tetrafluoroethylene-hexafluoropropylene copolymer resin (FEP) each sold under the brand name TEFLON® which is a registered trademark of the E.I. DuPont de Nemours and Company Corporation, 101 West 10th St., Wilmington, Del. 19898. Moreover, the hydrophobic insulating layer 555 may also include other hydrophobic materials such as, for example, polyperflouro-butenylvinylether sold under the brand name CYTOP which is a registered trademark of Asahi Glass co., Ltd.

A common electrode 592 may be disposed on the second substrate 590. The common electrode 592 may be disposed on a surface of the second substrate 590 opposite to the first substrate 500. The common electrode 592 may be, for example, a transparent electrode.

The fluid layer 560 may include, for example, a polarity fluid 565 and a non-polarity fluid 561. The non-polarity fluid 561 and the polarity fluid 565 may not be mixed to form a boundary. The non-polarity fluid 561 and the polarity fluid 565 may be located between the first substrate 500 and the second substrate 590. For example, the non-polarity fluid 561 may be an oil material, and the polarity fluid 565 may be a electrolyte solution such as water. The polarity fluid 565 may be shared by the pixel regions PA neighboring with each other. The non-polarity fluid 561 may be disposed and confined in each of the pixel regions PA. That is, the non-polarity fluids 561 in the pixel regions PA may be spaced apart from each other. The non-polarity fluid 561 may be, for example, non-transparent. Or the non-polarity fluid 561 may have a color autonomously. Alternatively, the non-polarity fluid 561 may have, for example, a color by a dye or a pigment. On the other hand, the polarity fluid 565 may be, for example, transparent.

Even though not shown, thin film transistors (not shown) and an interlayer insulating layer (not shown) covering the thin film transistors may further be disposed on the first substrate 500. The thin film transistors may be connected in series to constitute a switching array selecting each of unit pixels. The interlayer insulating layer may transmit light. The interlayer insulating layer may include, for example, an organic material and/or an inorganic material, and the organic material may be a photocurable material. The interlayer insulating layer may be formed with, for example, a thickness for having a planarized top surface so that a winding caused by the thin film transistor does not appear.

According to an exemplary embodiment of the present invention, an organic material layer on a flexible mother substrate may be pressured to be planarized using a substrate or a mold opposite to a supporting substrate. Thus, a stress may not be supplied to the flexible mother substrate, such that a flexible substrate may be readily manufactured. If a viscosity of an organic material is lower, the organic material may be coated on the flexible mother substrate several times. Thus, the process time and the cost may increase and a stress supplied to the flexible mother substrate may increase. If a viscosity of an organic material is higher, the organic material may be non-uniformly formed on the flexible mother substrate. According to an exemplary embodiment of the present invention, a planarization layer may be formed by a relatively simple process to reduce the process costs. Additionally, the above-mentioned difficulties may be avoided and/or decreased.

Having described exemplary embodiments of the inventive concept, it is further noted that it is readily apparent to those of reasonable skill in the art that various modifications may be made without departing from the spirit and scope of the invention which is defined by the metes and bounds of the appended claims.

What is claimed is:

1. A method of manufacturing a flexible substrate, comprising:
   mounting a substrate on a first supporting substrate;
   forming an organic material layer on the substrate;
   planarizing the organic material layer by pressuring the organic material layer with a second supporting substrate opposite to the first supporting substrate; and
   curing the organic material layer.

2. The method of claim 1, wherein the curing of the organic material layer comprises providing at least one of heat and light to the organic material layer.

3. The method of claim 2, further comprising:
   providing the heat and/or the light to the organic material layer before the planarizing of the organic material layer.

4. The method of claim 2, further comprising:
   forming a desorption layer on a surface of the second supporting substrate before the planarizing of the organic material layer,
   wherein the surface of the second supporting substrate faces the organic material layer.

5. The method of claim 4, further comprising:
   forming a barrier layer protecting the organic material layer on the desorption layer.

6. The method of claim 4, further comprising:
   removing the desorption layer to separate the second supporting substrate from the first supporting substrate.

7. The method of claim 2, wherein the organic material layer includes an organic material having a curable contraction rate of no greater than about 20%.

8. The method of claim 7, wherein the organic material includes at least one of 2(2-ethoxyethoxy) ethyl acrylate, and polyethylene glycol diacrylate.

9. The method of claim 1, wherein the first supporting substrate is a glass substrate.

10. The method of claim 1, wherein the second supporting substrate is a glass substrate.

11. The method of claim 1, wherein the substrate is a fiber reinforced plastic.

12. A method of manufacturing a flexible substrate, comprising:
    mounting a substrate on a supporting substrate;
    forming an organic material layer on the substrate;
    planarizing the organic material layer by pressuring the organic material layer with a mold disposed opposite to the supporting substrate; and
    curing the organic material layer,
    wherein the organic material layer includes an organic material having a curable contraction rate of no greater than about 20%.

13. The method of claim 12, wherein the mold includes a flat portion having a flat surface, and a sidewall portion surrounding the flat portion; and
    wherein a thickness of the organic material layer is controlled by a height of the sidewall portion.

14. The method of claim 13, wherein the curing of the organic material layer comprises providing at least one of heat and light to the organic material layer.

15. The method of claim 12, wherein the organic material includes at least one of 2(2-ethoxyethoxy) ethyl acrylate, and polyethylene glycol diacrylate.

16. The method of claim 12, wherein the substrate is a fiber reinforced plastic.

17. A method for manufacturing a flexible substrate, comprising:
    forming a transparent textile including a plurality of first transparent fibers and a plurality of second transparent fibers intersecting with the plurality of first transparent fibers;
    soaking the transparent textile with a polymer resin in a liquid state in a container;
    removing the transparent textile from the container and coating the transparent textile with a resin layer such that the resin layer fills a space between the first and second transparent fibers to thereby form a flexible mother substrate;
    disposing the flexible mother substrate on a first supporting substrate having a substantially flat surface;
    coating an organic material on the flexible mother substrate;
    curing the organic material to form an organic material layer on the flexible mother substrate;
    performing a soft bake process on the organic material layer to remove a solvent in the organic material layer;
    forming a desorption layer on a second supporting substrate;
    bonding the first supporting substrate and the second supporting substrate to each other such that the organic material layer and the desorption layer face each other and a surface of the organic material layer contacting the desorption layer is planarized by the bonding process;
    curing the organic material layer by a hard bake process to form a planarization layer between the desorption layer and the flexible mother substrate; and
    removing the desorption layer from the second supporting substrate to thereby separate the second supporting substrate from the first supporting substrate and form a flexible substrate which includes the flexible mother substrate and the planarization layer which are sequentially stacked on the first supporting substrate.

18. The method of claim 17, wherein the first and second transparent fibers each include glass fibers and wherein the forming of the transparent textile includes weaving the glass fibers of the first and second transparent fibers together.

19. The method of claim 17, wherein the bonding of the first and second supporting substrates to each other is performed in a vacuum and wherein the desorption layer is removed using a laser.

* * * * *